US00RE38383E

(19) United States
(12) Reissued Patent
Choi

(10) Patent Number: US RE38,383 E
(45) **Date of Reissued Patent: *Jan. 13, 2004**

(54) METHOD FOR FORMING A VIA PLUG IN A SEMICONDUCTOR DEVICE

(75) Inventor: Kyeon K. Choi, Suwon (KR)

(73) Assignee: Hyundai Electronics Industries Co. Ltd. (KR)

( * ) Notice: This patent is subject to a terminal disclaimer.

(21) Appl. No.: 09/293,207

(22) Filed: Apr. 16, 1999

Related U.S. Patent Documents

Reissue of:
(64) Patent No.: 5,409,861
Issued: Apr. 25, 1995
Appl. No.: 08/305,306
Filed: Sep. 15, 1994

U.S. Applications:
(63) Continuation of application No. 08/734,784, filed on Oct. 15, 1996, now Pat. No. Re. 36,475.

(30) Foreign Application Priority Data

Sep. 15, 1993 (KR) ..... 93-18525

(51) Int. Cl.[7] ..... H01L 23/48

(52) U.S. Cl. ..... 438/753; 438/628; 438/629; 438/644; 438/675; 257/774; 257/763

(58) Field of Search ..... 438/618, 628, 438/629, 637, 638, 639, 640, 644, 675; 257/753, 760, 774, 763

(56) References Cited

U.S. PATENT DOCUMENTS

| | | | | |
|---|---|---|---|---|
| 5,198,389 A | * | 3/1993 | van der Putten et al. | |
| 5,232,872 A | | 8/1993 | Ohba | |
| 5,270,256 A | | 12/1993 | Bost et al. | |
| 5,320,979 A | | 6/1994 | Hashimoto et al. | |
| 5,394,012 A | * | 2/1995 | Kimura | 257/739 |
| RE36,475 E | * | 12/1999 | Choi | 438/628 |

FOREIGN PATENT DOCUMENTS

| | | | |
|---|---|---|---|
| EP | 0168828 A2 | | 1/1986 |
| EP | 0216017 | | 4/1987 |
| EP | 0255911 A2 | | 2/1988 |
| EP | 0300414 A1 | | 1/1989 |
| EP | 0168828 B1 | | 1/1992 |
| EP | 0500456 | | 8/1992 |
| GB | 2135123 | | 8/1984 |
| GB | 2253938 | | 9/1992 |
| JP | 0064927 | | 4/1982 |
| JP | 0061323 | | 3/1987 |
| JP | 62061323 | * | 3/1987 |
| JP | 0156820 | | 7/1987 |
| JP | 4056237 | | 2/1992 |
| JP | 04-196343 | | 7/1992 |
| JP | 4216548 | | 8/1992 |
| JP | 5259110 | | 10/1993 |

OTHER PUBLICATIONS

Patent Abstracts of Japan, vol. 011, No. 249, Aug. 13, 1987.
Panabiere et al., "Concept and Processing of Buring Photomasks," Revue de Physique Applique, vol. 25, No. 8, pp. 859–865, Aug. 1, 1990.
Chen, F.S., et al., "Advanced Triple Level Metal Interconnection for 0.6$\mu$m/5 V High Density/High Performance ASIC Technolgy," *VMIC Conference* (Jun. 8–9, 1993).

* cited by examiner

*Primary Examiner*—Tuan H. Nguyen
(74) *Attorney, Agent, or Firm*—Townsend and Townsend and Crew LLP

(57) ABSTRACT

A method of forming a via plug in a semiconductor device is disclosed. Metal nuclei are formed on the surface of the metal layer underlying the via hole. The metal layer, which is partially exposed between metal nuclei, is etched by means of a wet etching method, and accordingly, a plurality of etching grooves is formed on the partially exposed surface of the metal layer. As a result, the formation of such grooves has the effect of increasing the bottom surface area of the via hall, thereby increasing the adhesive strength to a contact surface of the via hall and decreasing the via resistance.

36 Claims, 2 Drawing Sheets

METHOD FOR FORMING A VIA PLUG IN A SEMICONDUCTOR DEVICE

Matter enclosed in heavy brackets [ ] appears in the original patent but forms no part of this reissue specification; matter printed in italics indicates the additions made by reissue.

*This application is a continuation of and claims the benefit of application Ser. No. 08/734,784, which is incorporated herein by reference in its entirety. This application and application Ser. No. 08/734,784, filed Oct. 15, 1996 (now RE 36,475), are copending and are both reissue applications of application Ser. No. 08/305,306, filed Sep. 15, 1994, now U.S. Pat. No. 5,409,861.*

FIELD OF THE INVENTION

The invention relates to a method of forming a via plug in a semiconductor device, more particularly, it relates to a method of forming a via plug by forming metal nuclei on the surface of a metal layer underlying a via hall and then etching the metal layer exposed between the metal nuclei by the wet etching method so that a plurality of etching grooves are formed thereupon. The formation of such grooves has the effect of increasing the bottom surface area of the via hall, thereby increasing the adhesive strength to a contact surface of the via hall and decreasing the via resistance.

INFORMATION DISCLOSURE STATEMENT

Generally, as integration of a semiconductor device is increased, the size of the via hall diminishes while the aspect ratio increases. If the depth of the via halls are different from each other, the via plug is formed on the via halls using tungsten. In order to form a uniform and complete via plug, pretreatment of the via halls is important. If the surface of the via halls is not uniform prior to and during application of the wet etching process, particles, such as a native oxide layer and polymer, are generated on the surface of the metal layer underlying the via halls. Accordingly, when the via plug is formed on the via halls, the tungsten is deposited with a lack of uniformity resulting in increased via resistance to; such increased resistance has a deleterious effect on subsequent processes culminating in the lowering of the electrical connecting characteristic of the semiconductor device.

Therefore, it is an object of the invention to provide a method of forming a via plug in a semiconductor device by which a fluorine particle and a native oxide layer formed on the surface of the metal layer underlying a via hole are removed and metal nuclei are formed on the surface of the metal layer. The metal layer between the metal nuclei is then exposed and etched by the wet etching method so as to increase the surface area of the adhesive contact area, thereby decreasing the via resistance while increasing the adhesive strength.

SUMMARY OF THE INVENTION

A method of forming a via plug according to the present invention in order to achieve the above object is comprised of the following steps:

A first metal layer is formed on a substrate and first, second and third insulating layers are sequentially deposited on the resulting substrate; the third insulating layer is then planarized;

A desired portion of the third, second and first insulating layer are etched using a contact mask until the first metal layer is exposed, thereby forming a via hole;

The via hole is pretreated by the dry etching method and then metal is selectively deposited on the surface of the first metal layer underlying the via hole using a metal depositing reactor, thereby forming metal nuclei;

The first metal layer exposed between the metal nuclei is etched so that a plurality of etching grooves is formed on the first metal layer.

BRIEF DESCRIPTION OF THE DRAWINGS

For fuller understanding of the nature and objects of the invention, reference should be made to the following detailed description taken in conjunction with the accompanying drawings in which.

Similar reference characters refer to similar parts throughout the several views of the drawings.

DETAILED DESCRIPTION OF THE INVENTION

FIGS. 1A through 1E are cross sectional views illustrating steps forming a via hole in a semiconductor device according to the present invention.

Figure 1A:
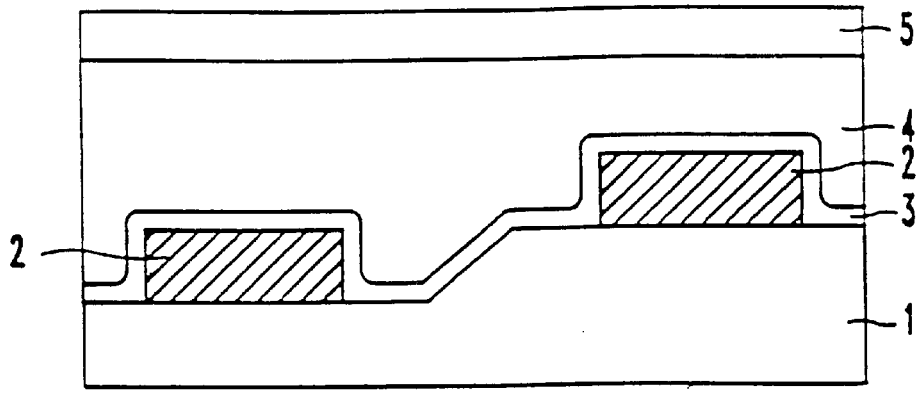
FIGS. 1A through 1E are cross sectional views illustrating steps forming a via hole in a semiconductor device according to the present invention.

Referring to FIG. 1A, a first metal layers 2 are initially formed on the substrate 1 in such a way so as to be isolated from each other. The first, second and third insulating layers 3, 4 and 5 are sequentially formed on the resulting substrate and then the third insulating layer 5 is planarized.

Figure 1B:
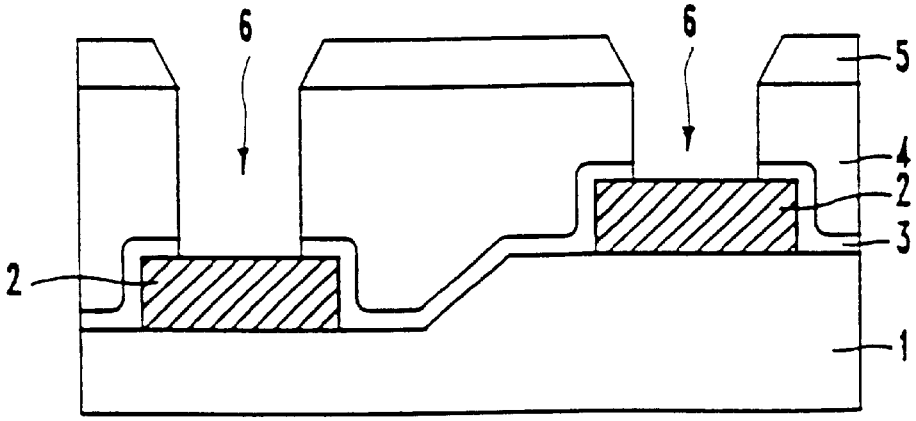

Referring to FIG. 1B, a desired portion of the first, second and third insulating layers 3, 4 and 5 situated on top of the first metal layers 2 are sequentially etched using the wet etching or dry etching method in order to connect to a second metal layer which will be formed in a later process, and thereby forming via holes 6 the aspect ratios of which are different from each other.

Figure 1C:
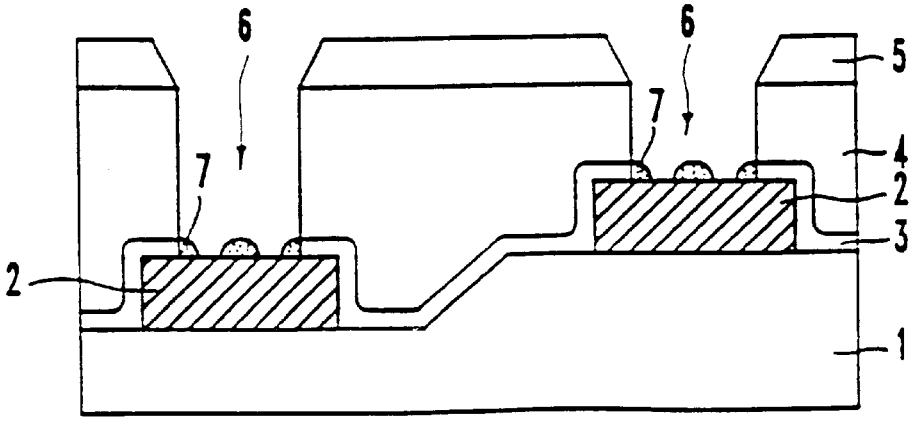

Referring to FIG. 1C, the via holes 6 are pretreated by the dry etching method in the RIE (Reactive Ion Etch) reactor during approximately one (1) minute using a $NF_3$, $SF_6$ or Ar sputter. Metal such as a tungsten(W), aluminum(Al), copper (Cu), molybdenum(Mo), titanium(Ti), cobalt(Co), or chromium(Cr) is then selectively deposited on the surface of the first metal layer 2 underlying the via holes 6 for a duration of approximately one (1) minute in the metal depositing reactor, thereby forming metal nuclei 7. The magnitude of the metal nuclei diameter is approximately 500 to 1000 Å. When the via holes 6 are pretreated, a fluorine particle compound and a native oxide layer is generated.

Figure 1D:
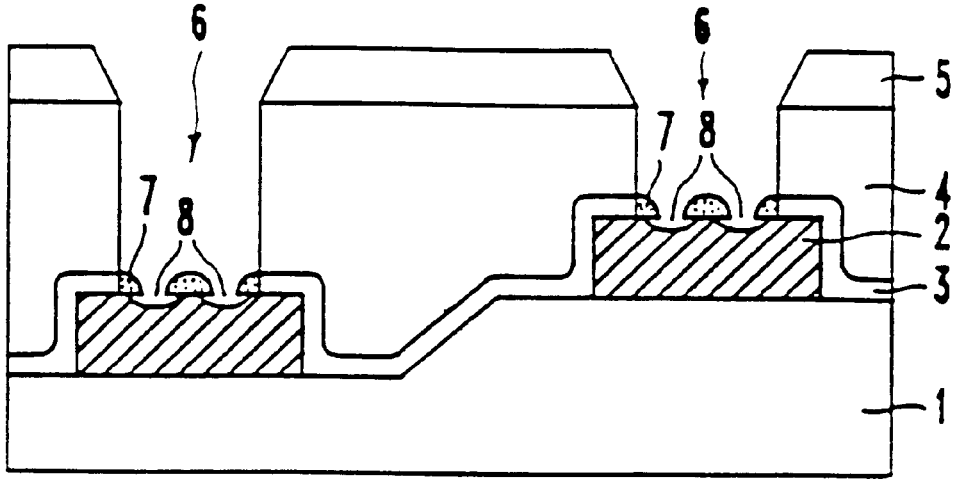

Referring to FIG. 1D, the first metal layer partially exposed between the metal nuclei 7 is etched by the wet etchant such as BOE (Buffered Oxide Etchant) in such a way that the metal nuclei 7 remains, and thereby forming a plurality of etching grooves 8 on the surface of the first metal layer 2. The wet etchant's etching selectivity is greater for the first metal layer 2 than it is for the metal nuclei 7.

As the wet etching method forms etching grooves 8 on the surface of the partially exposed metal layer, the contact area is increased and a fluorine particle compound, and native oxide layer are removed. As a result, when the via plug is formed on the via hole, the adhesive strength is increased while the via resistance is decreased.

Figure 1E:
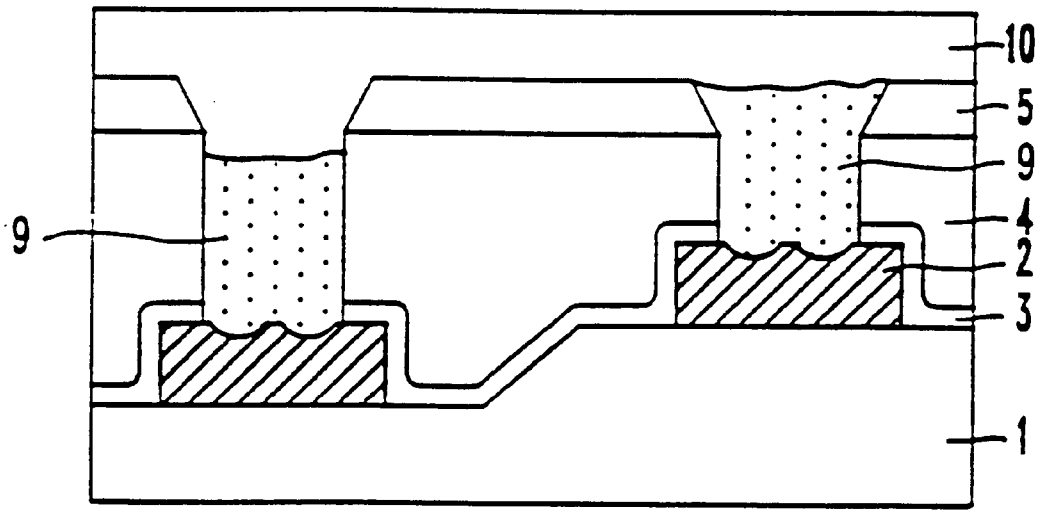

Referring to FIG. 1E, a via plug 9 is formed on the via holes 6 using a LPCVD reactor, and then a second metal layer 10 is formed to connect with the via plug 9.

As described above, according to the present invention, metal nuclei are formed on the via hole and then etching grooves are formed on the partially exposed metal layer under the via hole to increase the area of contact for connection with the via plug. Accordingly, the removal of particles which contribute to the increased via resistance results in a decrease of via resistance and improves the adhesive strength thereof. As a result, the electrical connection characteristic of the semiconductor device is improved.

Although this invention has been described in its preferred embodiment with a certain degree of particularity, one skilled in the art would know that the preferred embodiment disclosed here is only an example and that the construction, combination and arrangement of its parts may be varied without departing from the spirit and the scope of the invention.

What is claimed is:

[1. A method of forming a via plug in a semiconductor device comprises;

forming a first metal layer on a substrate and sequentially depositing a first, second and third insulating layer on the resulting substrate and then planarizing said third insulating layer;

etching a desired portion of said third, second and first insulating layer using a contact mask until said first metal layer is exposed, thereby forming a via hole;

pretreating said via hole by the dry etching method and then, forming metal nuclei on the surface of said first metal layer at the bottom of said via hole;

etching said first metal layer exposed between said metal nuclei so that a plurality of etching grooves is formed on said first metal layer; and forming a via plug on said via hole.]

[2. The method of claim 1, wherein said first metal layer exposed between said metal nuclei is etched by the wet etchant which the etching selectivity of said first metal layer is greater than said that of said metal nuclei.]

[3. The method of claim 1, wherein said via plug is formed in the LPCVD reactor.]

[4. The method of claim 1, wherein the magnitude of each nuclei is 500 to 1000 Å.]

[5. The method of claim 1, wherein said via hole is pretreated in the RIE reactor.]

[6. The method of claim 1, wherein said via hole is pretreated by a $NF_3$, $SF_6$ or Ar sputter.]

[7. The method of claim 1, wherein said etching grooves are formed using the buffered oxide etchant.]

[8. The method of claim 1, wherein said metal nuclei are formed by tungsten.]

[9. The method of claim 1, wherein said metal nuclei are formed by aluminum.]

[10. The method of claim 1, wherein said metal nuclei are formed by copper.]

[11. The method of claim 1, wherein said metal nuclei are formed by molybdenum.]

[12. The method of claim 1, wherein said metal nuclei are formed by titanium.]

[13. The method of claim 1, wherein said metal nuclei are formed by cobalt.]

[14. The method of claim 1, wherein said metal nuclei are formed by chromium.]

*15. A semiconductor device comprising:*

*a substrate;*

*a conductive layer overlying the substrate;*

*an insulating layer overlying the conductive layer;*

*a via structure in the insulating layer, the via structure exposing a portion of the conductive layer;*

*a plurality of grooves, the plurality of grooves being on the conductive layer within the exposed portion of the conductive layer, the plurality of grooves configured to increase surface area of the conductive layer;*

*a plurality of conductive nuclei, the conductive nuclei being on the conductive layer and adjacent to the plurality of grooves; and*

*a plug layer overlying the exposed portion in the via structure.*

*16. The semiconductor device of claim 15 wherein the increased surface area reduces a via resistance.*

*17. The semiconductor device of claim 15 wherein the increased surface area increases an adhesive strength.*

*18. The via structure of claim 17 wherein the adhesive strength is that of the conductive layer.*

*19. The via structure of claim 17 wherein the adhesive strength is that of the plug layer.*

*20. The semiconductor device of claim 15 wherein the plurality of grooves are formed by a process including etching.*

*21. The semiconductor device of claim 20 wherein the etching process for forming the plurality of grooves includes a buffered oxide etching process.*

*22. The semiconductor device of claim 20 wherein the etching process for forming the plurality of grooves includes a wet etching process.*

*23. The semiconductor device of claim 15 wherein the insulating layer includes a first insulating layer overlying the conductive layer and a second insulating layer overlying the first insulating layer.*

*24. The semiconductor device of claim 23 wherein the insulating layer further includes a third insulating layer over the second insulating layer.*

*25. The semiconductor device of claim 24 wherein the third insulating layer is planarized.*

*26. The semiconductor device of claim 15 wherein the exposed portion of the conductive layer is pretreated by an etching method.*

*27. A semiconductor device comprising:*

*a substrate;*

*a conductive layer overlying the substrate;*

*an insulating layer overlying the conductive layer;*

*a via structure in the insulating layer, the via structure exposing a portion of the conductive layer;*

*a plurality of grooves, the plurality of grooves being on the conductive layer within the exposed portion of the conductive layer, the plurality of grooves configured to increase surface area of the conductive layer;*

*a plurality of metal nuclei, the metal nuclei being on the conductive layer; and*

*a plug layer overlying the exposed portion in the via structure.*

*28. The semiconductor device of claim 27 wherein the plurality of metal nuclei are formed by a process including deposition.*

*29. The semiconductor device of claim 27 wherein each of the plurality of metal nuclei has a magnitude of 500 to 1,000 Å.*

*30. The semiconductor device of claim 27 wherein the metal nuclei comprise material selected from a group consisting of tungsten, aluminum, copper, molybdenum, titanium, cobalt, and chromium.*

*31. The semiconductor device of claim 15 wherein the insulating layer is planarized.*

*32. A via plug in a semiconductor device comprising:*

*a substrate;*

*a conductive layer overlying the substrate;*

*an insulating layer overlying the conductive layer, the insulating layer including a first insulating layer overlying said conductive layer and a second insulating layer overlying said first insulating layer;*

*a via structure in the insulating layer, the via structure exposing a portion of the conductive layer;*

*a plurality of grooves, the plurality of grooves being on said conductive layer and within the exposed portion of the conductive layer, the plurality of grooves configured to increase surface area of the conductive layer, the plurality of grooves being formed by a process including etching;*

*a plurality of conductive nuclei, the conductive nuclei being on the conductive layer and adjacent to the plurality of grooves; and*

*a plug layer overlying the exposed portion in the via structure.*

*33. A semiconductor device comprising:*

*a substrate;*

*a conductive layer overlying the substrate;*

*an insulating layer overlying the conductive layer, the insulating layer including a first insulating layer overlying said conductive layer and a second insulating layer overlying said first insulating layer;*

*a via structure in the insulating layer, the via structure exposing a portion of the conductive layer;*

*a plurality of grooves, the plurality of grooves being on the conductive layer and within the exposed portion of the conductive layer, the plurality of grooves configured to increase surface area of the conductive layer;*

*a plurality of conductive nuclei, the conductive nuclei being on the conductive layer and adjacent to the plurality of grooves; and*

*a plug layer overlying the exposed portion in the via structure.*

*34. The semiconductor device of claim 33 wherein the plurality of grooves are formed by a process including etching.*

*35. The semiconductor device of claim 34 wherein the etching is wet etching.*

*36. The semiconductor device of claim 34 wherein the etching is an act including a buffered oxide etching process.*

*37. The semiconductor device of claim 33 wherein the increased surface area reduces a via resistance.*

*38. The semiconductor device of claim 33 wherein the increased surface area increases an adhesive strength.*

*39. The via structure of claim 38 wherein the adhesive strength is that of the conductive layer.*

*40. The via structure of claim 38 wherein the adhesive strength is that of the plug layer.*

*41. The semiconductor device of claim 33 wherein the exposed portion of the conductive layer is pretreated by an etching method.*

*42. The semiconductor device of claim 33 wherein the insulating layer further includes a third insulating layer over the second insulating layer.*

*43. A semiconductor device comprising:*

*a substrate;*

*a conductive layer overlying the substrate;*

*an insulating layer overlying the conductive layer, the insulating layer including a first insulating layer overlying said conductive layer and a second insulating layer overlying said first insulating layer;*

*a via structure in the insulating layer, the via structure exposing a portion of the conductive layer;*

*a plurality of grooves, the plurality of grooves being on the conductive layer within the exposed portion of the conductive layer, the plurality of grooves configured to increase surface area of the conductive layer;*

*a plurality of metal nuclei, the metal nuclei being on the conductive layer; and*

*a plug layer overlying the exposed portion in the via structure.*

*44. The semiconductor device of claim 43 wherein the metal nuclei are formed by a process including deposition.*

*45. The semiconductor device of claim 33 wherein the insulating layer is planarized.*

*46. The semiconductor device of claim 15 wherein the conductive layer comprises a metal.*

*47. The semiconductor device of claim 33 wherein the conductive layer comprises a metal.*

*48. The semiconductor device of claim 43 wherein the metal nuclei comprise material selected from the group consisting of tungsten, aluminum, copper, molybdenum, titanium, cobalt, and chromium.*

*49. The semiconductor device of claim 43 wherein each of the plurality of metal nuclei has a magnitude of 500 to 1,000 Å.*

*50. A via plug in a semiconductor device comprising:*

*a substrate;*

*a conductive layer overlying the substrate;*

*an insulating layer overlying the conductive layer, the insulating layer including a first insulating layer overlying said conductive layer and a second insulating layer overlying said first insulating layer;*

*a via structure in the insulating layer, the via structure exposing a portion of the conductive layer;*

*a plurality of grooves, the plurality of grooves being on the conductive layer and within the exposed portion of the conductive layer, the plurality of grooves configured to increase surface area of the conductive layer, the plurality of grooves being formed by a process including etching;*

*a plurality of metal nuclei, the metal nuclei being on the conductive layer; and*

*a plug layer overlying the exposed portion in the via structure.*

* * * * *